United States Patent
Shen et al.

(10) Patent No.: US 9,279,871 B2
(45) Date of Patent: *Mar. 8, 2016

(54) SYSTEM AND APPARATUS FOR COMPENSATING FOR MAGNETIC FIELD DISTORTION IN AN MRI SYSTEM

(71) Applicant: General Electric Company, Schenectady, NY (US)

(72) Inventors: Weijun Shen, Florence, SC (US); Timothy J. Havens, Florence, SC (US); Longzhi Jiang, Florence, SC (US); Tesfaye K. Kidane, Waukesha, WI (US)

(73) Assignee: General Electric Company, Schenectady, NY (US)

( * ) Notice: Subject to any disclaimer, the term of this patent is extended or adjusted under 35 U.S.C. 154(b) by 507 days.

This patent is subject to a terminal disclaimer.

(21) Appl. No.: 13/690,312

(22) Filed: Nov. 30, 2012

(65) Prior Publication Data

US 2013/0154648 A1   Jun. 20, 2013

Related U.S. Application Data

(60) Provisional application No. 61/577,805, filed on Dec. 20, 2011.

(51) Int. Cl.
*G01V 3/00* (2006.01)
*G01R 33/34* (2006.01)
*G01R 33/389* (2006.01)
(Continued)

(52) U.S. Cl.
CPC ........ *G01R 33/34092* (2013.01); *G01R 33/389* (2013.01); *G01R 33/56509* (2013.01); *G01R 33/56518* (2013.01); *G01R 33/3875* (2013.01)

(58) Field of Classification Search
CPC ........... G01R 33/3815; G01R 33/3875; G01R 33/3873; G01R 33/3854; G01R 33/4215; G01R 33/387; G01R 33/42; G01R 33/34092; G01R 33/389; G01R 33/56509; G01R 33/56518
USPC ................................................ 324/300–322
See application file for complete search history.

(56) References Cited

U.S. PATENT DOCUMENTS 3,665,351 A   5/1972   Donaldson et al.
4,585,995 A   4/1986   Flugan (Continued)

FOREIGN PATENT DOCUMENTS

CN   1509684 A   7/2004
CN   1542876 A   11/2004

(Continued)

OTHER PUBLICATIONS

Jiang, et al., Vibration Induced Eddy Current and Its Effect on Image Quality for MRI System, Proc. Intl. Soc. Mag. Reson. Med. 16, 2008.*

(Continued)

*Primary Examiner* — Daniel Miller

(57) ABSTRACT

A magnet apparatus for a magnetic resonance imaging system, the magnet apparatus includes a vacuum vessel, a helium vessel disposed within the vacuum vessel and a thermal shield disposed between the vacuum vessel and the helium vessel. A set of passive compensation coils are disposed within the vacuum vessel or the helium vessel and used to compensate for magnetic field distortion caused by mechanical vibrations within the magnet apparatus.

18 Claims, 7 Drawing Sheets

(51) Int. Cl.
*G01R 33/565* (2006.01)
*G01R 33/3875* (2006.01)

(56) References Cited

U.S. PATENT DOCUMENTS

| | | | |
|---|---|---|---|
| 4,623,844 A | 11/1986 | Macovski | |
| 4,684,889 A | 8/1987 | Yamaguchi et al. | |
| 4,685,468 A | 8/1987 | Macovski | |
| 4,698,591 A | 10/1987 | Glover et al. | |
| 4,703,275 A | 10/1987 | Holland | |
| 4,733,189 A | 3/1988 | Punchard et al. | |
| 4,885,542 A | 12/1989 | Yao et al. | |
| 4,970,457 A | 11/1990 | Kaufman et al. | |
| 5,179,338 A * | 1/1993 | Laskaris et al. | 324/318 |
| 5,291,169 A * | 3/1994 | Ige et al. | 335/216 |
| 5,302,899 A | 4/1994 | Schett et al. | |
| 5,317,297 A | 5/1994 | Kaufman et al. | |
| 5,450,010 A | 9/1995 | Van Der Meulen et al. | |
| 5,453,010 A | 9/1995 | Klein | |
| 5,455,512 A | 10/1995 | Groen et al. | |
| 5,548,653 A | 8/1996 | Pla et al. | |
| 5,631,616 A | 5/1997 | Ohta et al. | |
| 5,668,516 A * | 9/1997 | Xu et al. | 335/216 |
| 5,706,575 A | 1/1998 | Kaufman et al. | |
| 5,782,095 A * | 7/1998 | Chen | 62/47.1 |
| 6,147,494 A | 11/2000 | Ham | |
| 6,157,276 A | 12/2000 | Hedeen et al. | |
| 6,246,308 B1 * | 6/2001 | Laskaris et al. | 335/216 |
| 6,326,788 B1 | 12/2001 | Mulder et al. | |
| 6,448,773 B1 | 9/2002 | Zhang | |
| 6,783,059 B2 | 8/2004 | Laskaris et al. | |
| 6,807,812 B2 | 10/2004 | Lehmann et al. | |
| 6,822,446 B2 | 11/2004 | Havens et al. | |
| 6,977,571 B1 * | 12/2005 | Hollis et al. | 335/216 |
| 7,034,537 B2 | 4/2006 | Tsuda et al. | |
| 7,112,964 B2 | 9/2006 | Zhou et al. | |
| 7,141,970 B2 | 11/2006 | Miyawaki et al. | |
| 7,208,952 B2 | 4/2007 | Dietz | |
| 7,352,184 B2 | 4/2008 | Komuro et al. | |
| 7,372,265 B2 | 5/2008 | Ham et al. | |
| 7,372,271 B2 | 5/2008 | Roozen et al. | |
| 7,432,712 B2 | 10/2008 | Motoshiromizu et al. | |
| 7,733,089 B2 | 6/2010 | Hobbs et al. | |
| 7,928,820 B2 | 4/2011 | Chiba et al. | |
| 2003/0179060 A1 | 9/2003 | Wang et al. | |
| 2004/0113619 A1 | 6/2004 | Schuster et al. | |
| 2004/0113620 A1 | 6/2004 | Tsuda et al. | |
| 2005/0179435 A1 | 8/2005 | Coughlin | |
| 2008/0168777 A1 | 7/2008 | Atkins et al. | |
| 2012/0274323 A1 | 11/2012 | He | |
| 2013/0157865 A1 * | 6/2013 | Shen et al. | 505/162 |
| 2013/0229065 A1 * | 9/2013 | Robertson et al. | 307/104 |
| 2014/0155268 A1 * | 6/2014 | Shen et al. | 505/162 |

FOREIGN PATENT DOCUMENTS

| | | |
|---|---|---|
| CN | 1957844 A | 5/2007 |
| CN | 101025438 A | 8/2007 |
| CN | 101221000 A | 7/2008 |
| CN | 101493505 A | 7/2009 |

OTHER PUBLICATIONS

Jiang, et al., Environmental Vibration Induced Magnetic Field Disturbance in MRI Magnet, IEEE Transactions on Applied Superconductivity, vol. 22, No. 3, Jun. 2012, first published Nov. 22, 2011.*
Search Report and Written Opinion from PCT Application No. PCT/US12/69713 dated May 7, 2013.
Unofficial English Translation of Chinese Office Action issued in connection with corresponding CN Application No. 201280063494.7 on Aug. 28, 2015.

* cited by examiner

SYSTEM AND APPARATUS FOR COMPENSATING FOR MAGNETIC FIELD DISTORTION IN AN MRI SYSTEM

CROSS REFERENCE TO RELATED APPLICATION

The present application claims the benefit of U.S. Provisional Application Ser. No. 61/577,805, filed Dec. 20, 2011, herein incorporated by reference in its entirety

FIELD OF THE INVENTION

The present invention relates generally to a magnetic resonance imaging (MRI) system and in particular to a system and apparatus for compensating for magnetic field distortion caused by mechanical vibrations in the MRI system.

BACKGROUND OF THE INVENTION

Magnetic resonance imaging (MRI) is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis," by convention). An MRI system also comprises components called gradient coils that produce smaller amplitude, spatially varying magnetic fields when a current is applied to them. Typically, gradient coils are designed to produce a magnetic field component that is aligned along the z axis, and that varies linearly in amplitude with position along one of the x, y or z axes. The effect of a gradient coil is to create a small ramp on the magnetic field strength, and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. The RF coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

During an MRI scan, various elements of the MRI system experience mechanical vibrations, such as the coldhead motor or gradient coil (e.g., as a result of pulsing of the gradient coil). Mechanical vibrations of the MRI system may also be caused by external sources such as floor vibrations caused by a nearby elevator or subway. The mechanical vibrations of such sources can cause the mechanical vibration of other elements inside the MRI system, such as a cryostat thermal shield, and induce eddy currents in electrically conductive material in the cryostat (e.g., the vacuum vessel, thermal shield, helium vessel). The induced eddy currents in, for example, the thermal shield, can result in magnetic field distortion, homogeneity degradation and reduce image quality. The higher the main magnetic field is, the higher the induced eddy current will be and hence the higher the magnetic field distortion.

It would be desirable to provide a system and apparatus to passively (e.g., automatically) cancel or reduce the magnetic field distortion caused by eddy currents induced by mechanical vibrations.

BRIEF DESCRIPTION OF THE INVENTION

In accordance with an embodiment, a magnet apparatus for a magnetic resonance imaging system, the magnet apparatus includes a vacuum vessel, a helium vessel disposed within the vacuum vessel, a thermal shield disposed between the vacuum vessel and the helium vessel, and a set of passive compensation coils disposed within the vacuum vessel.

In accordance with another embodiment, a magnet apparatus for a magnetic resonance imaging system includes a vacuum vessel, a helium vessel disposed within the vacuum vessel, a thermal shield disposed between the vacuum vessel and the helium vessel, and a set of passive compensation coils disposed within the helium vessel.

BRIEF DESCRIPTION OF THE DRAWINGS

The invention will become more fully understood from the following detailed description, taken in conjunction with the accompanying drawings, wherein like reference numerals refer to like parts, in which.

DETAILED DESCRIPTION

Figure 1:
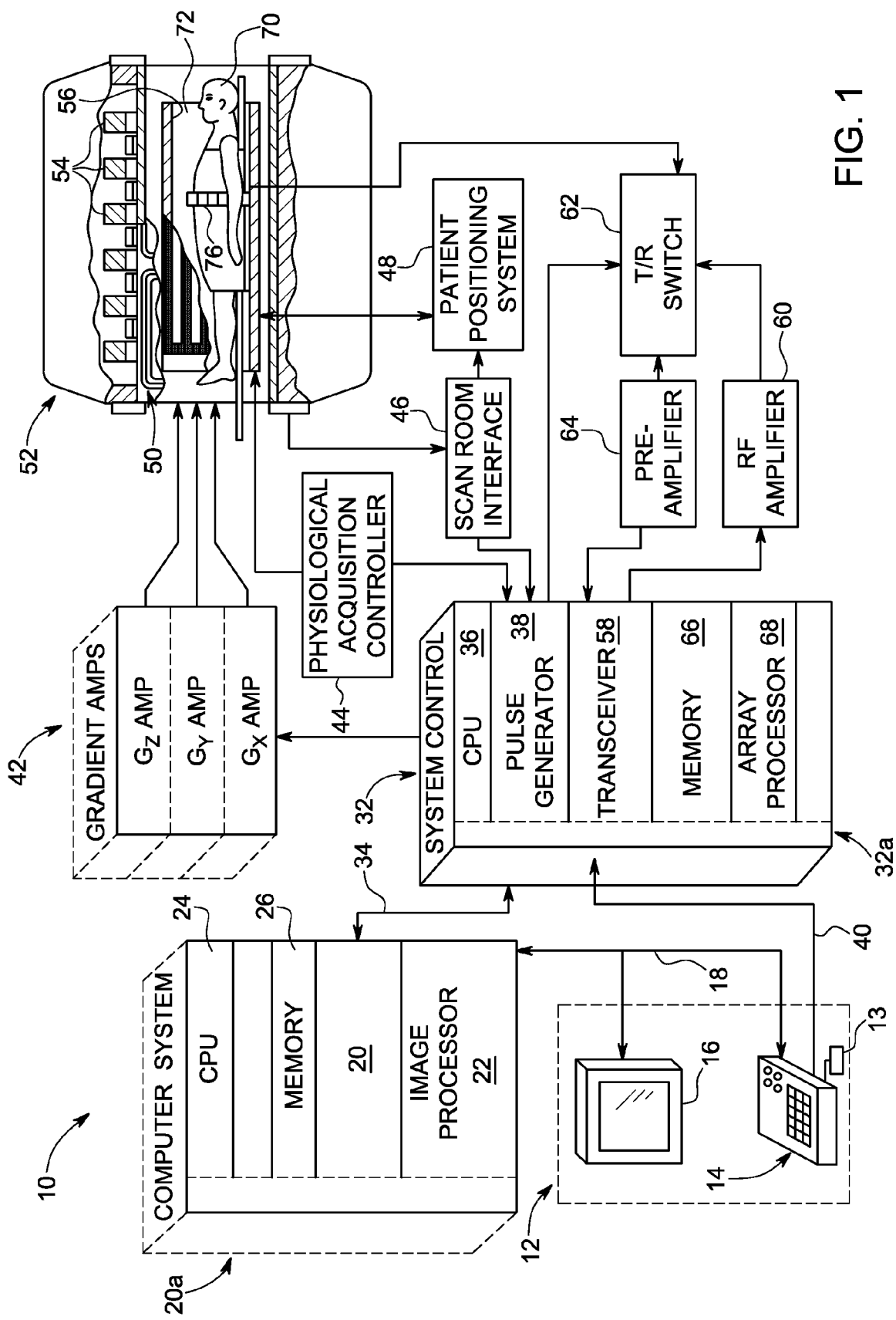
FIG. 1 is a schematic block diagram of an exemplary magnetic resonance imaging (MRI) system in accordance with an embodiment.

FIG. 1 is a schematic block diagram of an exemplary magnetic resonance imaging (MRI) system in accordance with an embodiment. The operation of MRI system 10 is controlled from an operator console 12 that includes a keyboard or other input device 13, a control panel 14, and a display 16. The console 12 communicates through a link 18 with a computer system 20 and provides an interface for an operator to prescribe MRI scans, display resultant images, perform image processing on the images, and archive data and images. The computer system 20 includes a number of modules that communicate with each other through electrical and/or data connections, for example, such as are provided by using a backplane 20a. Data connections may be direct wired links or may be fiber optic connections or wireless communication links or the like. The modules of the computer system 20 include an image processor module 22, a CPU module 24 and a memory module 26 which may include a frame buffer for storing image data arrays. In an alternative embodiment, the image processor module 22 may be replaced by image processing functionality on the CPU module 24. The computer system 20 is linked to archival media devices, permanent or back-up memory storage or a network. Computer system 20 may also communicate with a separate system control computer 32 through a link 34. The input device 13 can include a mouse, joystick, keyboard, track ball, touch activated screen, light wand, voice control, or any similar or equivalent input device, and may be used for interactive geometry prescription.

The system control computer 32 includes a set of modules in communication with each other via electrical and/or data connections 32a. Data connections 32a may be direct wired links, or may be fiber optic connections or wireless communication links or the like. In alternative embodiments, the modules of computer system 20 and system control computer 32 may be implemented on the same computer system or a plurality of computer systems. The modules of system control computer 32 include a CPU module 36 and a pulse generator module 38 that connects to the operator console 12 through a communications link 40. The pulse generator module 38 may alternatively be integrated into the scanner equipment (e.g., resonance assembly 52). It is through link 40 that the system control computer 32 receives commands from the operator to indicate the scan sequence that is to be performed. The pulse generator module 38 operates the system components that play out (i.e., perform) the desired pulse sequence by sending instructions, commands and/or requests describing the timing, strength and shape of the RF pulses and pulse sequences to be produced and the timing and length of the data acquisition window. The pulse generator module 38 connects to a gradient amplifier system 42 and produces data called gradient waveforms that control the timing and shape of the gradient pulses that are to be used during the scan. The pulse generator module 38 may also receive patient data from a physiological acquisition controller 44 that receives signals from a number of different sensors connected to the patient, such as ECG signals from electrodes attached to the patient. The pulse generator module 38 connects to a scan room interface circuit 46 that receives signals from various sensors associated with the condition of the patient and the magnet system. It is also through the scan room interface circuit 46 that a patient positioning system 48 receives commands to move the patient table to the desired position for the scan.

The gradient waveforms produced by the pulse generator module 38 are applied to gradient amplifier system 42 which is comprised of $G_x$, $G_y$, and $G_z$ amplifiers. Each gradient amplifier excites a corresponding physical gradient coil in a gradient coil assembly generally designated 50 to produce the magnetic field gradient pulses used for spatially encoding acquired signals. The gradient coil assembly 50 forms part of a resonance assembly 52 that includes a polarizing superconducting magnet with superconducting main coils 54. Resonance assembly 52 may include a whole-body RF coil 56, surface or parallel imaging coils 76 or both. The coils 56, 76 of the RF coil assembly may be configured for both transmitting and receiving or for transmit-only or receive-only. A patient or imaging subject 70 may be positioned within a cylindrical patient imaging volume 72 of the resonance assembly 52. A transceiver module 58 in the system control computer 32 produces pulses that are amplified by an RF amplifier 60 and coupled to the RF coils 56, 76 by a transmit/receive switch 62. The resulting signals emitted by the excited nuclei in the patient may be sensed by the same RF coil 56 and coupled through the transmit/receive switch 62 to a preamplifier 64. Alternatively, the signals emitted by the excited nuclei may be sensed by separate receive coils such as parallel coils or surface coils 76. The amplified MR signals are demodulated, filtered and digitized in the receiver section of the transceiver 58. The transmit/receive switch 62 is controlled by a signal from the pulse generator module 38 to electrically connect the RF amplifier 60 to the RF coil 56 during the transmit mode and to connect the preamplifier 64 to the RF coil 56 during the receive mode. The transmit/receive switch 62 can also enable a separate RF coil (for example, a parallel or surface coil 76) to be used in either the transmit or receive mode.

The MR signals sensed by the RF coil 56 or parallel or surface coil 76 are digitized by the transceiver module 58 and transferred to a memory module 66 in the system control computer 32. Typically, frames of data corresponding to MR signals are stored temporarily in the memory module 66 until they are subsequently transformed to create images. An array processor 68 uses a known transformation method, most commonly a Fourier transform, to create images from the MR signals. These images are communicated through the link 34 to the computer system 20 where it is stored in memory. In response to commands received from the operator console 12, this image data may be archived in long-term storage or it may be further processed by the image processor 22 and conveyed to the operator console 12 and presented on display 16.

Figure 2:
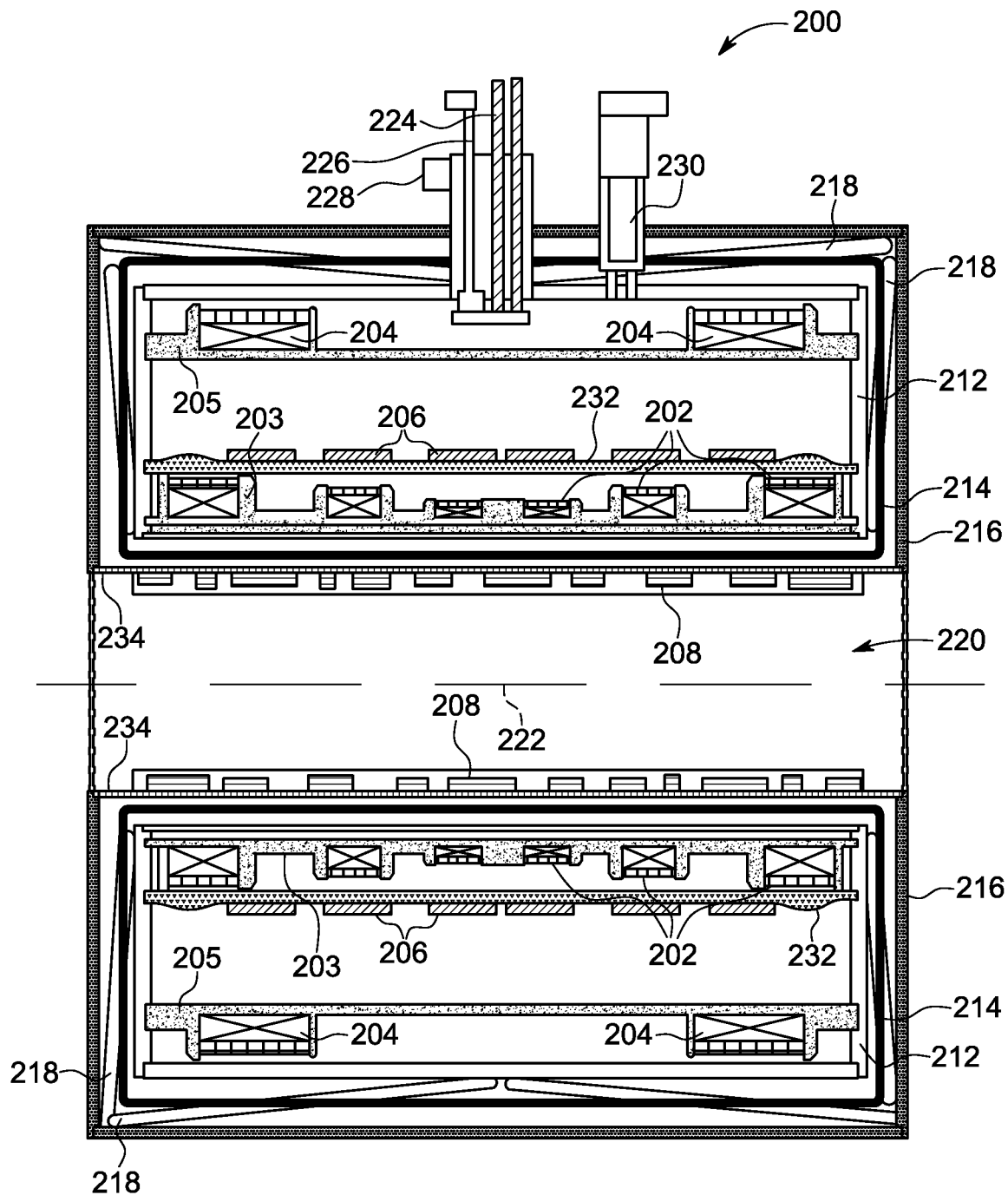
FIG. 2 is a schematic cross-sectional side elevation view of a magnet assembly in accordance with an embodiment.

FIG. 2 is a schematic cross-sectional side elevation view of a magnet assembly in accordance with an embodiment. Magnet assembly 200 may be used in a resonance assembly such as resonance assembly 52 of MRI system 10 shown in FIG. 1. The magnet assembly 200 is cylindrical in shape and surrounds a cylindrical patient volume 220. A center axis 222 is aligned parallel to the direction of the main magnetic field, B0, generated by main superconducting coils 202 of the magnet assembly 200. Main coils 202 consist of several radially aligned and longitudinally spaced apart superconducting coils, each capable of carrying a large current. As mentioned, the main coils 202 are designed to create the main magnetic field, B0, within the patient volume 220. Main coils 202 are positioned on a main coil former 203 which is cylindrical in shape and provides support for the main coils 202 and inter coil forces. An outer set of superconducting bucking or shielding coils 204 are used to provide, for example, control of stray magnetic fields. Bucking coils 204 are positioned on a bucking coil former 205 which is cylindrical in shape and provides support for the bucking coils 204 and inter coil forces.

The main coils 202 and bucking coils 204 are enclosed in a cryostat to provide a cryogen environment designed to maintain the temperature of the superconducting coils below the appropriate critical temperature so that the superconducting coils are in a superconducting state with zero resistance. Main coils 202 and bucking coils 204 are enclosed within a helium vessel 212 which is designed to provide the operational environment (e.g., to contain and cool) for the superconducting coils. A set of superconducting active shim coils 206 may also be disposed within the helium vessel 212 and are used to provide manufacturing tolerance compensation. Active shims 206 are positioned on a former 232 which is cylindrical in shape. Helium vessel 212 is disposed within a vacuum vessel 216 which is configured to maintain a vacuum environment and is used to control the thermal load. A thermal shield 214 is disposed between the vacuum vessel 216 and the helium vessel 212. The thermal shield 214 is used to cool and control the coldmass thermal load. Suspension members 218 are positioned between the helium vessel 212 and the vacuum vessel 216 to provide mechanical support of the coldmass and thermal shield 214. Passive shims 208 may be positioned on an inner cylindrical surface (or warm bore) 234 of the vacuum vessel 216 to provide manufacturing tolerance compensation. Main leads 224 are used to provide current input to the main magnet coils 202 and shim lead 226 is used to provide current input to the active shims 206. Instrumentation 228 is used to monitor magnet 200 parameters. Various other elements such as covers, end caps, supports, brackets, etc. are omitted from FIG. 2 for clarity.

A coldhead 230 (including, e.g., a recondenser) is used to manage the cryostat heat loads with, preferably, zero helium boil-off. During operation of the magnet assembly 200, coldhead 230 generates mechanical vibrations (e.g., from a motor) that cause induced eddy currents in the thermal shield 214 as well as in other elements in the cryostat with electrically conductive material. In addition, the mechanical vibrations of the coldhead 230 may cause mechanical vibration of the thermal shield 214. For example, eddy currents may be induced when the thermal shield 214 is alternated (or vibrates) in a z-axis direction, an x-axis direction or a y-axis direction. The eddy currents induced by the mechanical vibrations will cause magnetic field distortion and homogeneity degradation of the main magnetic field, B0. The magnetic field distortion can cause image distortion and affect image quality. To reduce, cancel or compensate the magnetic field distortion, passive compensation coils are incorporated inside the magnet assembly 200. In a preferred embodiment, a set of passive compensation coils is provided for each orthogonal direction (X, Y, Z). In other embodiments, multiple sets of coils may be used for each orthogonal direction. As discussed further below, the passive compensation coils may be positioned at various radial cylindrical locations within the vacuum vessel 216 and at various locations along the cylindrical length of elements within the vacuum vessel 216.

Figure 3:
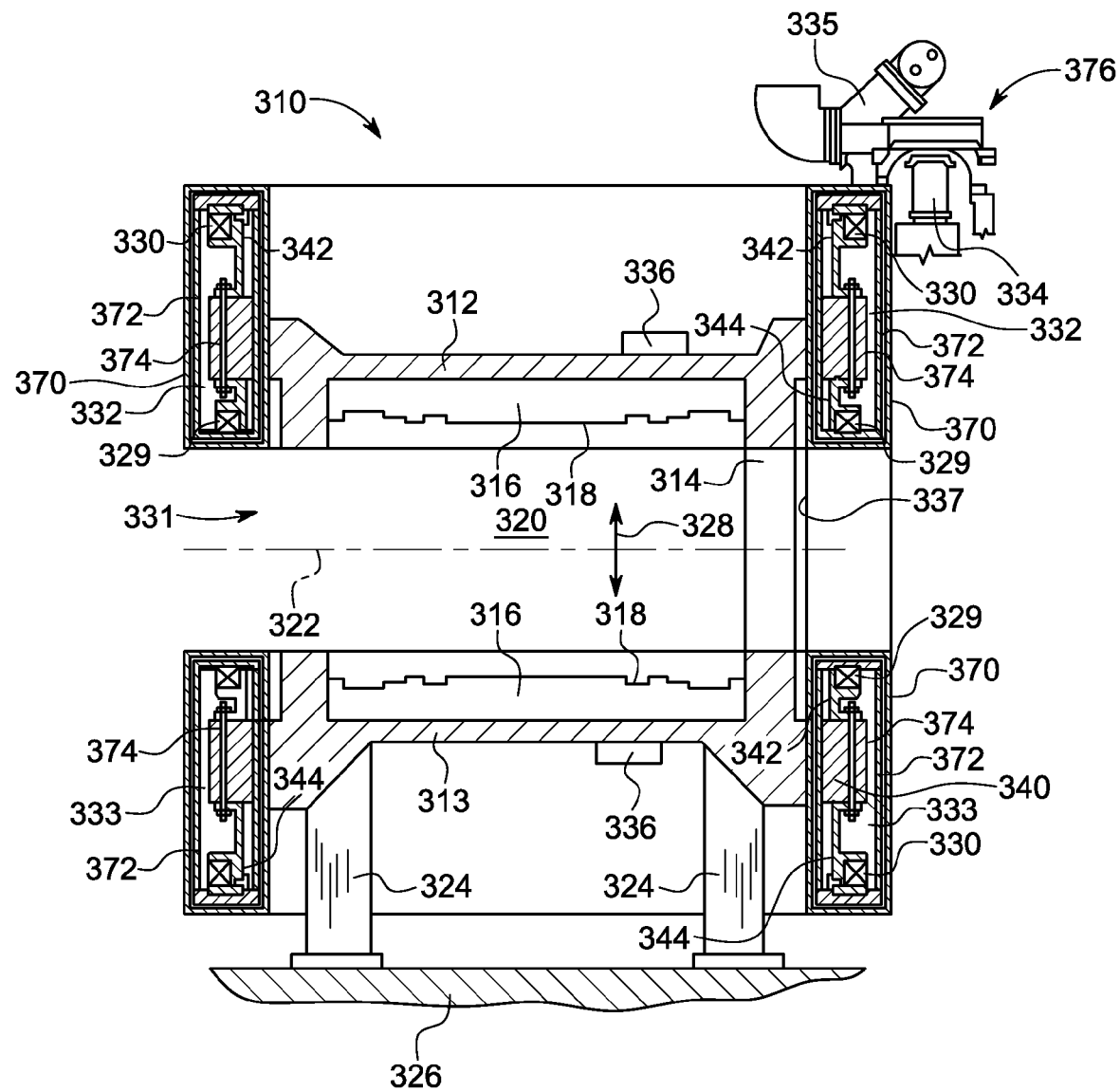
FIG. 3 is a simplified cross-sectional side view of an exemplary open architecture magnet assembly in accordance with an embodiment.

In an alternative embodiment, the magnet assembly may be a open architecture magnet assembly. FIG. 3 is a simplified cross-sectional side view of an exemplary open architecture magnet assembly in accordance with an embodiment. An open architecture superconducting magnet 310 includes spaced parallel pole pieces 312 and 313 separated and supported at one end by a pair of non-magnetic connecting members or posts 314. Pole pieces 312 and 313 are of ferromagnetic material such as iron. Pole faces 316 are shaped 318 to improve magnetic field inhomogeneity within imaging region 320 along axis 322 of superconducting magnet 310. Supports 324 secure the magnet 310 to floor 326.

The main magnetic field, $B_o$, indicated generally by arrow 328 within imaging region 320 is generated by main superconducting magnet coils 329 within helium vessels 332 and 333. An outer set of superconducting bucking or shielding coils 330 are also positioned within helium vessels 332 and 333 and are used to provide, for example, control of stray magnetic fields. Spaced helium vessels 332 and 333 are cylindrical members providing an open end 331 to imaging region 320. Magnetic field shimming apparatus such as active shim coils (not shown) within cryogen vessels 332 and 333 and passive shims in external shim drawers indicated generally as 336 compensate for magnetic field inhomogeneties within imaging region 320 in the manner well known in the art. Helium vessels 332 and 333 are disposed within a cryogen pressure vessel or vacuum vessel 370. A thermal shield 372 is disposed between vacuum vessel 370 and helium vessels 332 and 333. Superconducting magnet coils 329 and 330 are assembled into a magnet assembly with cold iron ring 340 interposed between the coils. Main coils 329 and bucking coils 330 are supported on coil formers or supports 344 and 342 (e.g., composed of glass fiber-epoxy composite), respectively, in pockets machined for the coils. Active shim coils (not shown) are positioned on a former 376.

A condenser 334 and associated mechanical cryocooler 335 (together part of a coldhead 376) recondenses helium gas which results from the superconducting operation back to liquid helium. The recondensed liquid helium flows from recondenser 334 by gravity into upper helium vessel 332. A vertical transfer tube 337 interconnects helium vessels 332 and 333 and enables the gravity flow of helium from upper helium vessel 332 to lower helium vessel 333. As mentioned above with respect to FIG. 2, during operation of the magnet assembly 310, coldhead 376 generates mechanical vibrations (e.g., from a motor) that cause induced eddy currents in the thermal shield 372 as well as in other elements in the cryostat with electrically conductive material. In addition, the mechanical vibrations of the coldhead 376 may cause mechanical vibration of the thermal shield 372. For example, eddy currents may be induced when the thermal shield 372 is alternated (or vibrates) in a z-axis direction, an x-axis direction or a y-axis direction. The eddy currents induced by the mechanical vibrations will cause magnetic field distortion and homogeneity degradation of the main magnetic field, B0. The magnetic field distortion can cause image distortion and affect image quality. To reduce, cancel or compensate the magnetic field distortion, passive compensation coils are incorporated inside the magnet assembly 310. In a preferred embodiment, a set of passive compensation coils is provided for each orthogonal direction (X, Y, Z). In other embodiments, multiple sets of coils may be used for each orthogonal direction. As discussed further below, the passive compensation coils may be positioned at various radial cylindrical locations within the vacuum vessel 370 and at various locations along the cylindrical length of elements within the vacuum vessel 370.

Figure 4:
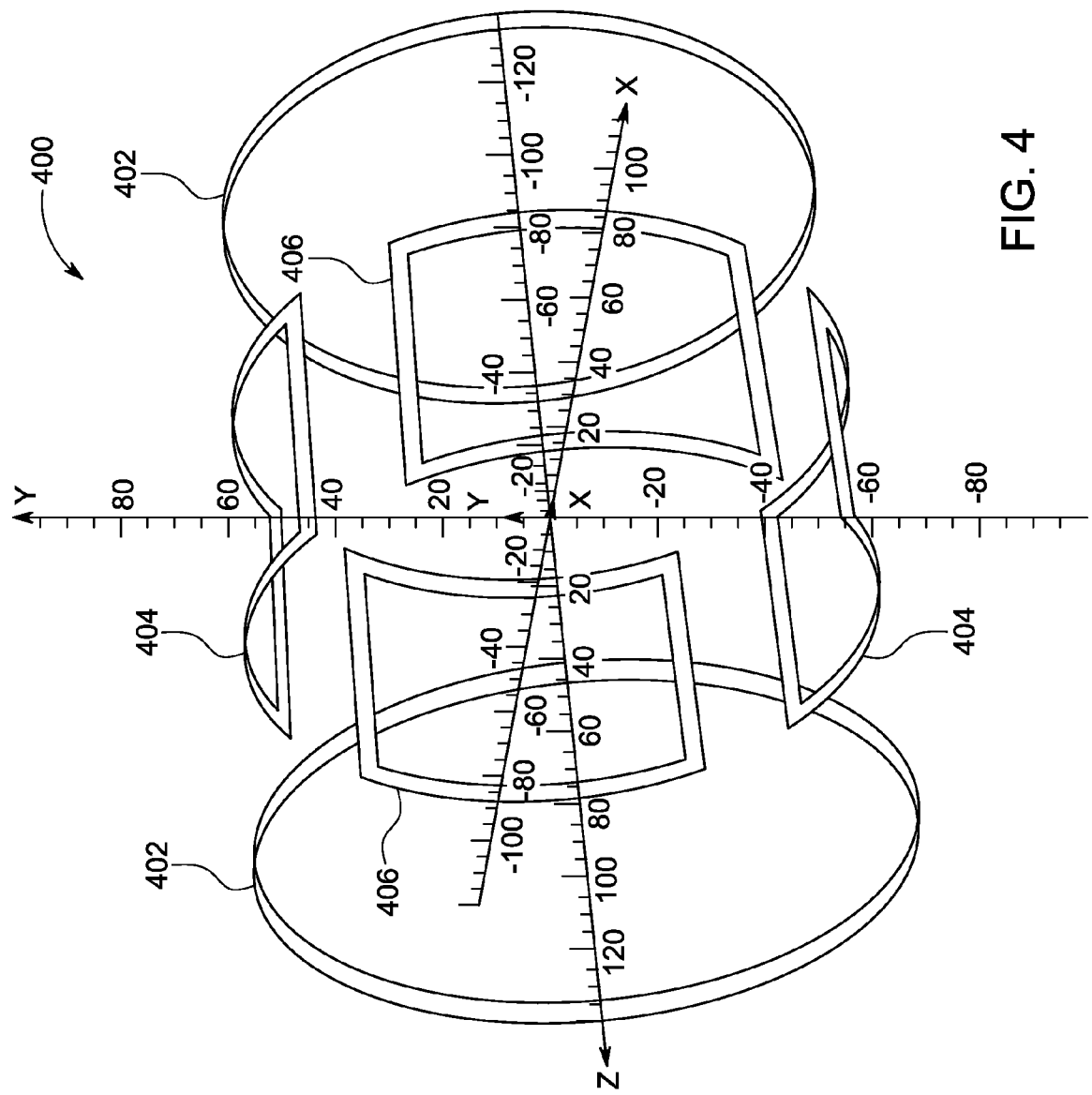
FIG. 4 is a schematic diagram showing a plurality of exemplary sets of passive compensation coils in accordance with an embodiment.

FIG. 4 is a schematic diagram showing a plurality of exemplary sets of passive compensation coils in accordance with an embodiment. In FIG. 4, three sets 400 of passive compensation coils are shown, specifically, one set for each orthogonal direction (X, Y, Z). A first set of passive compensation coils 402 for the z-axis direction includes two coils configured to be positioned around a cylindrically shaped element within, for example, helium vessel 212 shown in FIG. 2. A second set of passive compensation coils 404 for the y-axis direction includes two coils configured to be positioned around a cylindrically shaped element within, for example, helium vessel 212 shown in FIG. 2. A third set of passive compensation coils 406 for the x-axis direction includes two coils configured to be positioned around a cylindrically shaped element within, for example, helium vessel 212 shown in FIG. 2. While each coil set 402, 404 and 406 in FIG. 4 is shown with two passive compensation coils, the number of coils in each set may be greater than two. In addition, in other embodiments, different coil shapes may be used. The shape, location and number of passive compensation coils may be based on, for example, the amount of cancellation or compensation needed in the imaging volume, the distance from the thermal shield, the design needed to magnetically couple with the thermal shield, etc.

Figure 5:
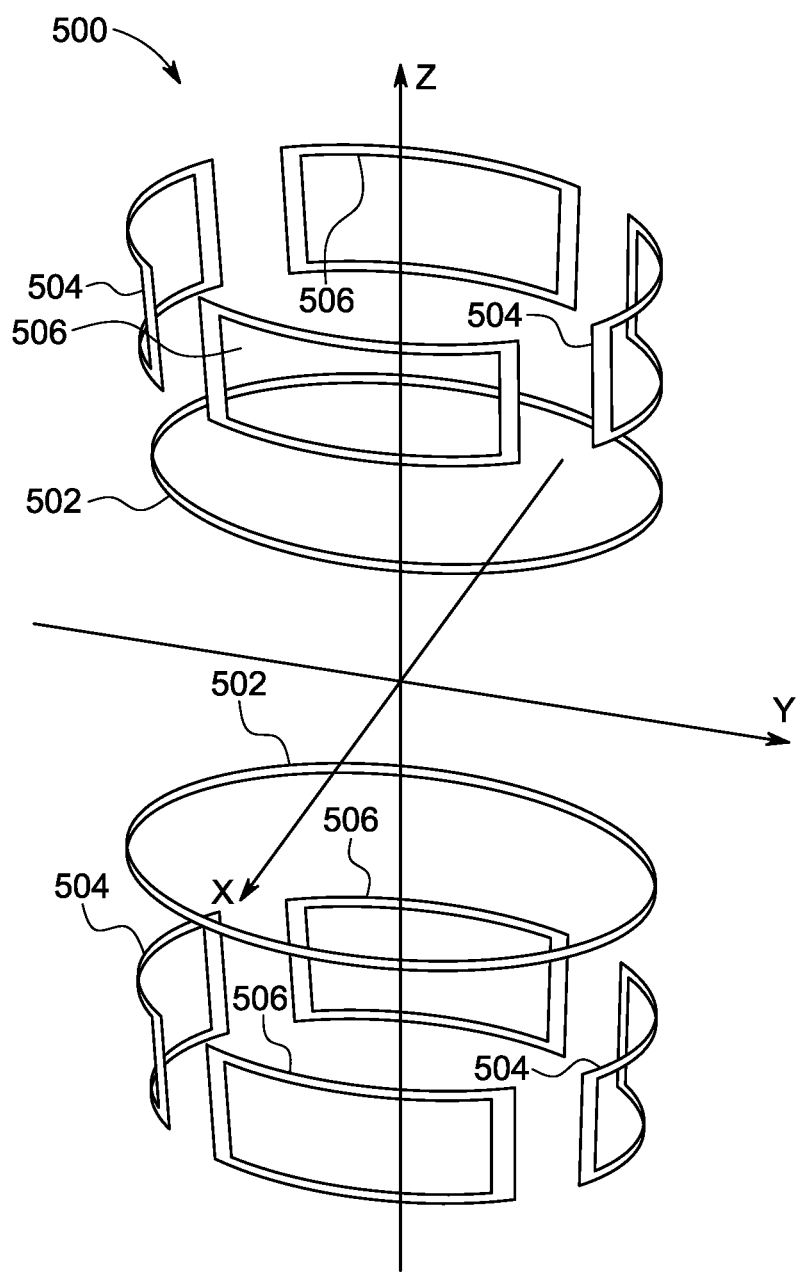
FIG. 5 is a schematic diagram showing a plurality of exemplary sets of passive compensation coils in accordance with an alternative embodiment.

FIG. 5 is a schematic diagram showing a plurality of exemplary sets of passive compensation coils for an open architecture magnet assembly in accordance with an alternative embodiment. In FIG. 5, three sets 500 of passive compensation coils are shown, specifically, one set for each orthogonal direction (X, Y, Z). A first set of passive compensation coils 502 for the z-axis direction includes two coils configured to be positioned around an element within, for example, helium vessels 332 and 333 shown in FIG. 3. A second set of passive compensation coils 504 for the y-axis direction includes two coils configured to be positioned around an element within, for example, helium vessels 332 and 333 shown in FIG. 3. A third set of passive compensation coils 506 for the x-axis direction includes two coils configured to be positioned around an element within, for example, helium vessels 332 and 333 shown in FIG. 3. While each coil set 502, 504 and 506 in FIG. 5 is shown with two passive compensation coils, the number of coils in each set may be greater than two. In addition, in other embodiments, different coil shapes may be used. The shape, location and number of passive compensation coils may be based on, for example, the amount of cancellation or compensation needed in the imaging volume, the distance from the thermal shield, the design needed to magnetically couple with the thermal shield, etc.

The passive compensation coils may be constructed using known superconducting materials, for example, MbB2 wire, MgB2 tape, low or mid temperature superconductors such as NbTi—Cu wire, Nb3Sn—Cu wire, Nb3Sn—Cu tape or high temperature superconductors such as BSCCO-2212, BSCCO-2223 and YBCO. In a preferred embodiment, the passive compensation coils are designed to magnetically couple with the thermal shield, the helium vessel or the vacuum vessel. The mechanical vibrations (e.g., from the coldhead and thermal shield) induce electrical current in the passive compensation coils. The induced electrical current in the passive compensation coils generates a magnetic field contribution opposite to the magnetic field generated by the eddy currents induced in, for example, the thermal shield by the mechanical vibrations. Preferably, the sum of the magnetic field distortion caused by the induced electrical current in the compensation coils and the magnetic field distortion cause by the induced eddy currents in, for example, the thermal shield is minimized.

Figure 6:
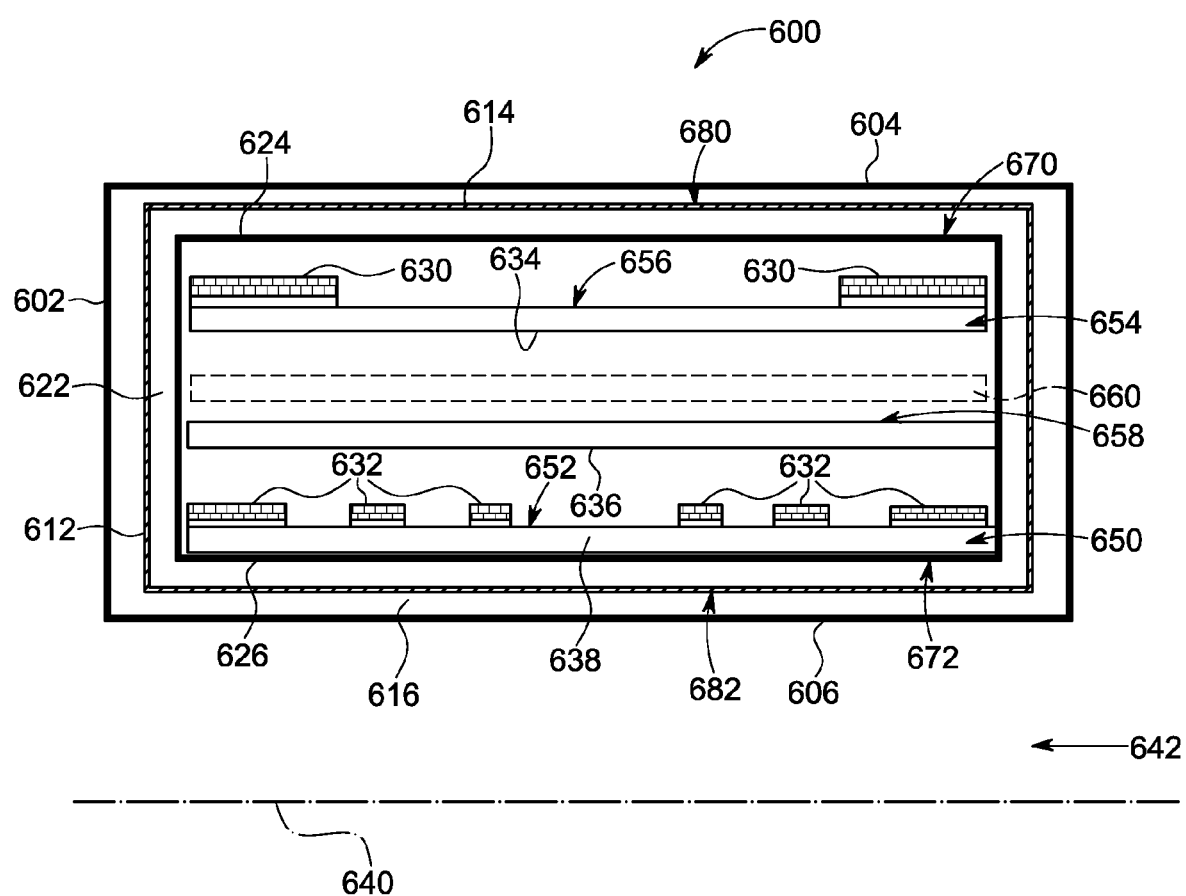
FIG. 6 is a schematic cross-sectional block diagram of a magnet assembly cryostat showing exemplary radial locations for passive compensation coils in accordance with an embodiment.

As mentioned above, the passive compensation coils may be located at various radial locations within the helium vessel or the vacuum vessel. FIG. 6 is a schematic cross-sectional block diagram of a magnet assembly cryostat showing exemplary radial locations for passive compensation coils in accordance with an embodiment. Cryostat 600 includes a vacuum vessel that has an outer cylinder 604 and an inner cylinder 606 coupled together by an end flange 602. Disposed within the vacuum vessel is a helium vessel that has an outer cylinder 624 and an inner cylinder 626 coupled together by an end flange 622. A thermal shield is positioned between the vacuum vessel and the helium vessel. The thermal shield include an outer cylinder 614 and an inner cylinder 616 coupled together by an end flange 612. Various superconducting coils are housed within the helium vessel including, for example, mains coils 632, bucking coils 630 and active shims (not shown). Main coils 632 are disposed on a main coil former 638. Bucking coils 630 are disposed on a bucking coil former 634. A shim coil former 636 is used to support active shims (not shown). Various other elements such as covers, supports, suspension members, brackets, cold head, current leads, etc. are omitted from FIG. 6 for clarity.

In one embodiment, a low or mid temperature superconducting material is used to construct the passive compensation coils. Example radial locations for the passive compensation coils made of a low temperature superconducting material are inside the main coil former 650 (e.g., inside of a fiberglass former), an outer surface 652 of the main coil former, inside of the bucking coil former 654 (e.g., inside of a fiberglass former), an outer surface 656 of the bucking coil former or an outer surface 658 of the shim coil former.

In another embodiment, the superconducting material used to construct the passive compensation coils is MgB2. Example radial locations for the passive compensation coils made of MgB2 are an outer surface 670 of the outer cylinder of the helium vessel, an outer surface 672 of the inner cylinder of the helium vessel, an outer surface 652 of the main coil former, an outer surface 656 of the bucking coil former or an outer surface 658 of the shim coil former.

In yet another embodiment, a high temperature superconducting material is used to construct the passive compensation coils. Example radial locations for the passive compensation coils made of a high temperature superconducting material are an outer surface 680 of the outer cylinder of the thermal shield, an outer surface 682 of the inner cylinder of the thermal shield, an outer surface 670 of the outer cylinder of the helium vessel, an outer surface 672 of the inner cylinder of the helium vessel, inside the main coil former 650 (e.g., inside of a fiberglass former), an outer surface 652 of the main coil former, inside of the bucking coil former 654 (e.g., inside of a fiberglass former), an outer surface 656 of the bucking coil former or an outer surface 658 of the shim coil former. In yet another embodiment, for passive compensation coils constructed of any type of superconducting material, a separate independent former 660 may be provided in the helium vessel and the passive compensation coils disposed on the separate former 660.

Figure 7:
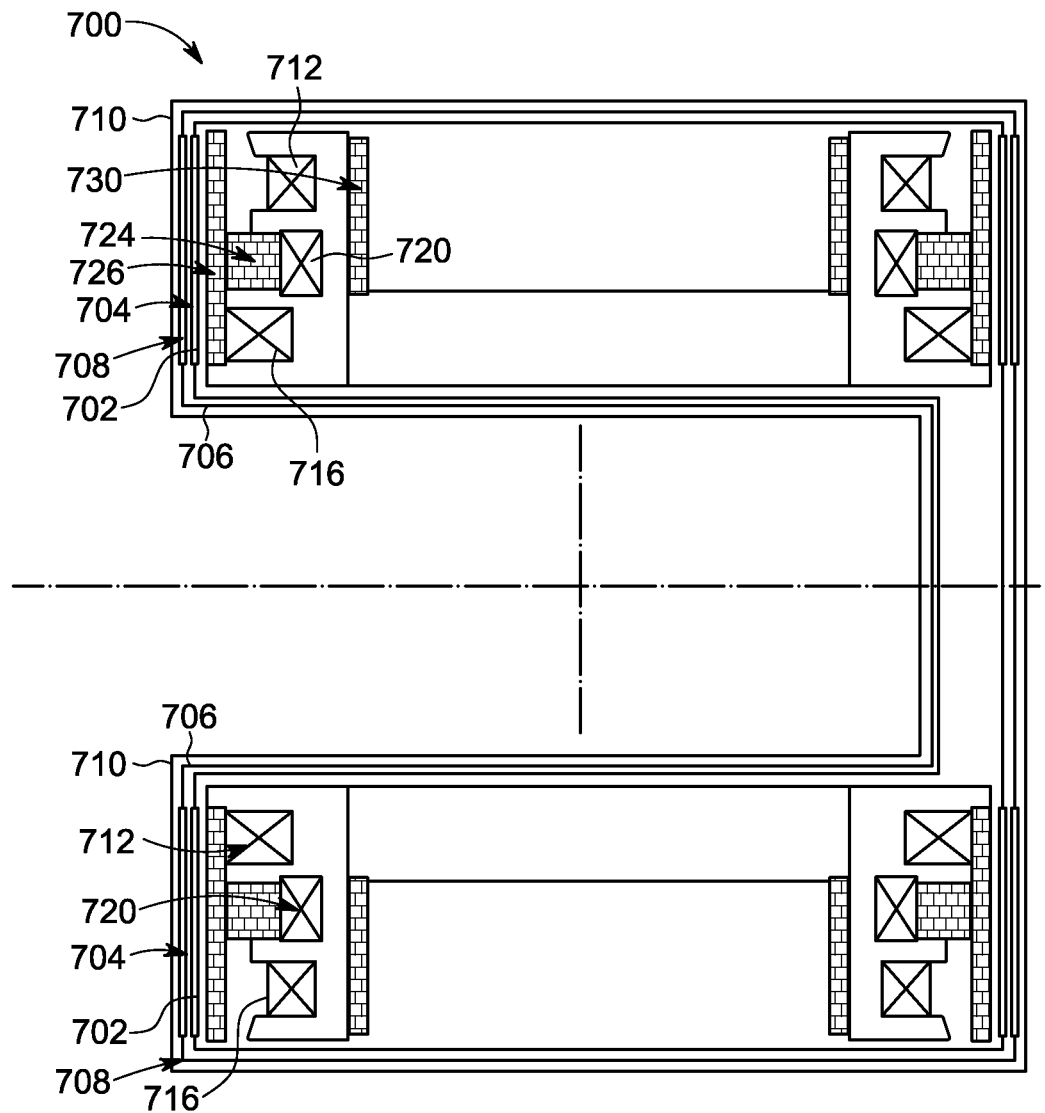
FIG. 7 is a schematic cross-sectional block diagram of an open architecture magnet assembly cryostat showing exemplary radial locations for passive compensation coils in accordance with an alternative embodiment

FIG. 7 is a schematic cross-sectional block diagram of an open architecture magnet assembly cryostat showing exemplary radial locations for passive compensation coils in accordance with an alternative embodiment Cryostat 700 includes a vacuum vessel 710 and a helium vessel 702 disposed within the vacuum vessel. A thermal shield 706 is positioned between the vacuum vessel 710 and the helium vessel 702. Various superconducting coils are housed within the helium vessel 702 including, for example, mains coils 712, bucking coils 716 and active shims 720. Main coils 712 are disposed on a main coil former 714. Bucking coils 716 are disposed on a bucking coil former 718. A shim coil former 722 is used to support active shims. Various other elements such as covers, supports, suspension members, brackets, cold head, current leads, etc. are omitted from FIG. 7 for clarity.

In one embodiment, a low or mid temperature superconducting material is used to construct the passive compensation coils. Example radial locations for the passive compensation coils made of a low temperature superconducting material are an inner diameter 730 of the main or bucking coil formers, the top 724 of the superconducting coils 712, 716, 720 (for example, on its own coil former (not shown)), and an outer diameter 726 of the main coil structure (inside the helium vessel 702), for example, the compensation coils can be attached to main former structure with a fiberglass cylinder support (not shown). In another embodiment, the superconducting material used to construct the passive compensation coils is MgB2. An example radial location for the passive compensation coils made of MgB2 is an outer surface 704 of the helium vessel 702. In yet another embodiment, a high temperature superconducting material is used to construct the passive compensation coils. An example radial location for the passive compensation coils made of a high temperature superconducting material is an outer surface 708 of the thermal shield 708.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

We claim:

1. A magnet apparatus for a magnetic resonance imaging system, the magnet apparatus comprising:
    a vacuum vessel;
    a helium vessel disposed within the vacuum vessel;
    a thermal shield disposed between the vacuum vessel and the helium vessel; and
    a set of passive compensation coils disposed within the vacuum vessel configured to compensate for magnetic field distortion caused by mechanical vibrations within the magnet apparatus;
    wherein the set of passive compensation coils comprises:
        a first set of passive compensation coils for a z-axis direction;
        a second set of passive compensation coils for a y-axis direction; and
        a third set of passive compensation coils for an x-axis direction.

2. A magnet apparatus according to claim 1, wherein the passive compensation coils are superconducting coils.

3. A magnet apparatus according to claim 2, wherein the passive compensation coils are constructed from a low temperature superconducting material.

4. A magnet apparatus according to claim 2, wherein the passive compensation coils are constructed from a high temperature superconducting material.

5. A magnet apparatus according to claim 1, wherein the helium vessel comprises an outer cylinder and an inner cylinder, the outer cylinder having an outer surface and the set of passive compensation coils disposed on the outer surface of the outer cylinder of the helium vessel.

6. A magnet apparatus according to claim 1, wherein the helium vessel comprises an outer cylinder and an inner cylinder, the inner cylinder having an outer surface and the set of passive compensation coils disposed on the outer surface of the inner cylinder of the helium vessel.

7. A magnet apparatus according to claim 1, wherein the thermal shield comprises an outer cylinder and an inner cylinder, the outer cylinder having an outer surface and the set of passive compensation coils disposed on the outer surface of the outer cylinder of the thermal shield.

8. A magnet apparatus according to claim 1, wherein the thermal shield comprises an outer cylinder and an inner cylinder, the inner cylinder having an outer surface and the set of passive compensation coils disposed on the outer surface of the inner cylinder of the thermal shield.

9. A magnet apparatus for a magnetic resonance imaging system, the magnet apparatus comprising:
    a vacuum vessel;
    a helium vessel disposed within the vacuum vessel;
    a thermal shield disposed between the vacuum vessel and the helium vessel; and
    a set of passive compensation coils disposed within the helium vessel configured to compensate for magnetic field distortion caused by mechanical vibrations within the magnet apparatus;
    wherein the set of passive compensation coils comprises:
        a first set of passive compensation coils for a z-axis direction;
        a second set of passive compensation coils for a y-axis direction; and
        a third set of passive compensation coils for an x-axis direction.

10. A magnet apparatus according to claim 9, wherein the passive compensation coils are superconducting coils.

11. A magnet apparatus according to claim 10, wherein the passive compensation coils are constructed from a low temperature superconducting material.

12. A magnet apparatus according to claim 10, wherein the passive compensation coils are constructed from a high temperature superconducting material.

13. A magnet apparatus according to claim 9, further comprising:
    a main coil former disposed inside the helium vessel; and
    wherein the set of passive compensation coils are positioned inside of the main coil former.

14. A magnet apparatus according to claim 9, further comprising:
    a main coil former disposed inside the helium vessel and having an outer surface; and
    wherein the set of passive compensation coils are positioned on the outer surface of the main coil former.

15. A magnate apparatus according to claim 9, further comprising:
    a bucking coil former disposed inside the helium vessel; and
    wherein the set of passive compensation coils are positioned inside of the bucking coil former.

16. A magnet apparatus according to claim 9, further comprising:
    a bucking coil former disposed inside the helium vessel and having an outer surface; and
    wherein the set of passive compensation coils are positioned on the outer surface of the bucking coil former.

17. A magnet apparatus according to claim 9, further comprising:
    a shim coil former disposed inside the helium vessel and having an outer surface; and
    wherein the set of passive compensation coils are positioned on the outer surface of the shim coil former.

18. A magnet apparatus according to claim 9, further comprising:
    a passive compensation coil former disposed inside the helium vessel and having an outer surface; and
    wherein the set of passive compensation coils are positioned on the outer surface of the passive compensation coil former.

* * * * *